United States Patent
Chevallier et al.

(10) Patent No.: US 6,769,103 B2
(45) Date of Patent: Jul. 27, 2004

(54) LINE WIDTH CHECK IN LAYOUT DATABASE

(75) Inventors: Christophe Chevallier, Palo Alto, CA (US); Adriana Ababei, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/199,727

(22) Filed: Jul. 19, 2002

(65) Prior Publication Data

US 2004/0015797 A1 Jan. 22, 2004

(51) Int. Cl.⁷ ............................................. G06F 17/50
(52) U.S. Cl. ................................................. 716/5; 716/4
(58) Field of Search ....................................... 716/5, 4

(56) References Cited

U.S. PATENT DOCUMENTS

| | | | |
|---|---|---|---|
| 5,706,295 A | 1/1998 | Suzuki | |
| 5,963,729 A * | 10/1999 | Aji et al. | 716/5 |
| 6,038,020 A | 3/2000 | Tsukuda | |
| 6,038,383 A * | 3/2000 | Young et al. | 716/5 |
| 6,078,737 A | 6/2000 | Suzuki | |
| 6,115,546 A | 9/2000 | Chevallier et al. | |
| 6,271,548 B1 * | 8/2001 | Umemoto et al. | 257/202 |
| 6,295,627 B1 | 9/2001 | Gowni et al. | |
| 6,425,113 B1 | 7/2002 | Anderson et al. | |
| 6,470,477 B1 | 10/2002 | Scott | |
| 6,487,706 B1 * | 11/2002 | Barkley et al. | 716/7 |
| 6,516,451 B1 | 2/2003 | Patin | |
| 6,546,540 B1 | 4/2003 | Igarashi et al. | |

* cited by examiner

Primary Examiner—Vuthe Siek
Assistant Examiner—Brandon Bowers
(74) Attorney, Agent, or Firm—Leffert Jay & Polglaze, P.A.

(57) ABSTRACT

A method for checking the accuracy of non-standard line widths in a layout includes marking lines with a line width marker, and associating the line width markers with the lines throughout a design process to ensure that the lines remain at the desired widths.

7 Claims, 4 Drawing Sheets

LINE WIDTH CHECK IN LAYOUT DATABASE

FIELD

The present invention relates generally to integrated circuit layout, and more specifically to verification of integrated circuit layouts.

BACKGROUND

Typical micron level integrated circuit manufacture requires extensive layout of components and pathways between components. The pathways between components carry signals and power back and forth between components. Some components do not require much power or do not carry much current. Pathways between these types of components can be made very small in width of the metal that carries the signals or the power. However, other components have higher power or current requirements.

As power and current requirements go up, a standard minimum line width for carrying power or current between or to those components is insufficient. Typical minimum line widths for components that do not draw much current are on the order of 0.2 microns wide. On the other hand, lines that carry power or current to or from supplies and large components may need to be on the order of 10 to 1000 microns wide. The wider lines are required to carry the current as well as to avoid resistive drops and electro migration problems.

Various software solutions exist to perform certain checking of parameters in schematics, layouts, and the like. A typical design process begins with schematic, moves to layout, and then to design and on to fabrication. Along the way, checks are typically made of parameters and the like. For example, a line width check program checks to see if the lines in the (schematic or layout) are at least at or above an absolute minimum width (usually 0.2 microns). When the layout is complete, aside from the line width check, an inspection is made, typically manually, of checking that the lines that are required or called for to be a width greater than the absolute minimum are indeed laid out at the required or called for widths. Since integrated circuits can be extremely complex, such a visual inspection is very time consuming, and is prone to human error.

Once the layout is complete, a layout versus schematic program is run. The layout versus schematic program compares the electrical circuit design (schematic) with the physical design (layout). Once the layout is complete and checked with the LVS, a design is extracted. When the design has been extracted, a design rule checker (DRC) program is run. The DRC measures spacing, overlap, and sizes of masking dimensions and the like on the layout to ensure that circuit dimensions will conform to the fabrication process capabilities. The DRC includes a check for line widths only to the extent that it checks to see that each line is at least an absolute minimum width. Lines requiring a greater width are not verified to that greater width.

For the reasons stated above, and for other reasons stated below which will become apparent to those skilled in the art upon reading and understanding the present specification, there is a need in the art for improved checking of layout line widths in integrated circuit layouts.

SUMMARY

In one embodiment, a method for checking accuracy of an integrated circuit includes tagging at least one line with a width marker, laying out the lines, retrieving the width marker for each tagged line, and comparing the actual line width with the marker line width.

In another embodiment, a method of checking for errors in line width in an integrated circuit includes defining a line width layer, identifying with a marker any lines having a line width greater than a default minimum line width, and associating a line width parameter with each line width marker, the line width parameter corresponding to a line width for the marked line. The line width parameters and line width markers are converted to lines in a layout, and the line width parameters for each line width marker are compared to the actual layout line width.

In yet another embodiment, a method for checking layout accuracy in an integrated circuit design includes creating a schematic, adding a line width marker to selected lines having a width greater than an absolute minimum width, and assigning a line width to each line width marker. A layout is created from the schematic, and the layout is checked versus the schematic. A design is extracted from the layout, and the design line width marker is checked versus the marker line width for each line having a line width marker.

In still another embodiment, a method of performing a design rule check on an integrated circuit includes tagging at least one line with a width marker in a schematic, extracting each line having a width marker in a layout, comparing the schematic versus the layout, checking a layout line with the extracted width, and generating an error condition for any line with a layout width less than its extracted width.

In yet another embodiment, a method of performing a layout versus schematic check on an integrated circuit includes comparing layout line widths with existing line width marker parameters for selected lines of the circuit, and indicating an error if a layout line width is less than its line width marker parameter.

In another embodiment, a method of identifying line width errors in an integrated circuit design includes adding a line width marker for each of a plurality of lines on a schematic, assigning a line width parameter to each line width marker, creating a layout from the schematic, the layout containing the line width markers, checking the layout line widths versus the schematic line widths for the plurality of line width marked lines; creating a design from the layout, and checking the design line widths versus the layout line widths for the plurality of line width marked lines.

In still another embodiment, a method of design rule checking an integrated circuit includes identifying any line having a line width marker and line width parameter, extracting each line having a line width marker, determining the line width parameter for each extracted line, and comparing the line width parameter with an actual line width for the line.

In still another embodiment, method of design rule checking an integrated circuit includes identifying any line having a line width marker and line width parameter, excluding the line if it is near or above a transistor, extracting each line having a line width marker, determining the line width parameter for each extracted line, and comparing the line width parameter with an actual line width for the line.

In another embodiment, a schematic for an integrated circuit includes a number of circuit components interconnected by lines, a number of width markers each assigned a width marker having a minimum width parameter.

In another embodiment, a schematic for an integrated circuit includes a number of circuit components interconnected by lines, and a line width layer including a line width marker for each line having a width greater than a standard minimum width, and a line width parameter for each line width marker.

Other embodiments are described and claimed.

DETAILED DESCRIPTION

Figure 1:
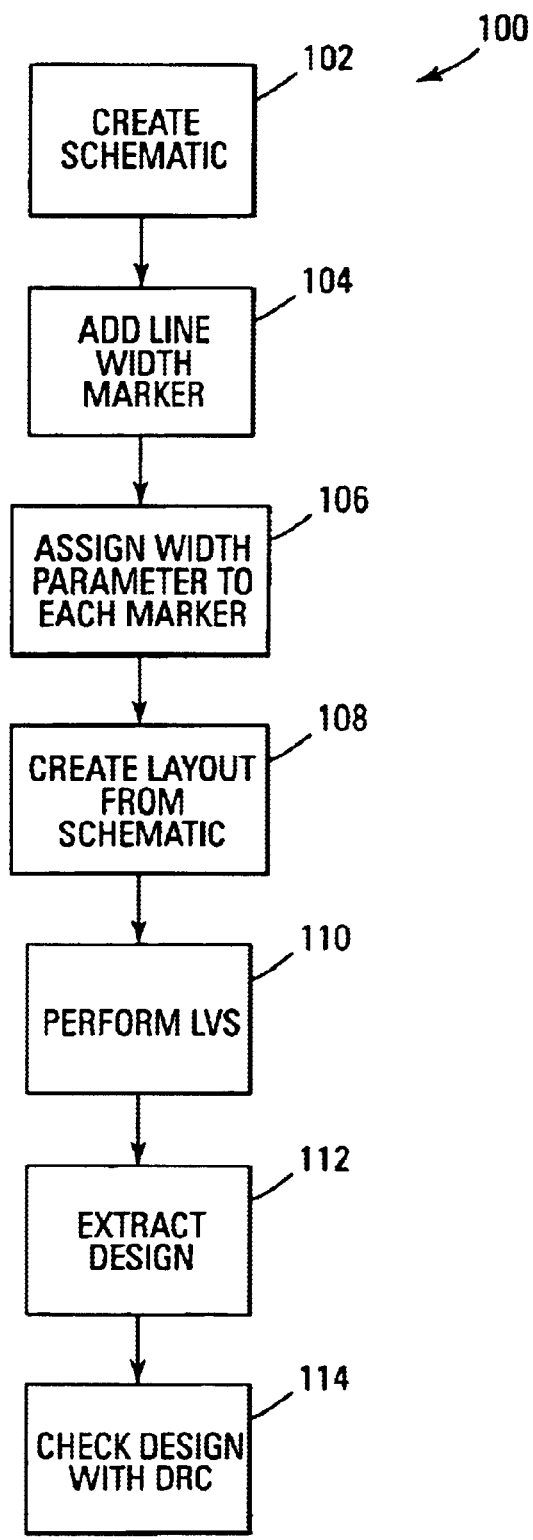
FIG. 1 is a flow chart diagram of a method according to an embodiment of the present invention.

In the following detailed description of the embodiments, reference is made to the accompanying drawings, which form a part hereof, and in which is shown by way of illustration specific embodiments in which the inventions may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense, and the scope of the present invention is defined only by the claims.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Unless specifically stated otherwise as apparent from the following discussions, it is appreciated that throughout the present invention, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

In this application, a design refers to a set of netlists, which are representations of connections and elements of a circuit. A netlist is a list of nets and transistors present in a layout. A netlist can be extracted from a schematic or a layout. Netlists are representations of all connections and elements present in layout or schematic, in other words a list of nets and transistors. Design in the various embodiments of the invention is of netlists which are representations of the connections and elements present in the layout and the schematic.

FIG. 1 is a flow chart diagram of a method 100 for checking the accuracy of an integrated circuit layout and design. Method 100 comprises creating a schematic in block 102, and adding line width markers to selected lines having a line width greater than an absolute minimum line width in block 104. For each line having a line width marker, a width parameter is assigned in block 106. A layout is created from the schematic in block 108. In one embodiment, the layout has the line width markers and parameters integrated therein. In another embodiment, the layout is drawn as specified by the parameters of the markers, as it is not necessary to put the markers in the layout. If a line has a marker in the schematic, that line can be matched to a line in the layout and need not be duplicated in the layout itself. This layout may be drawn manually, and may not necessarily be accurate. A layout versus schematic operation is run in block 110 to check that the layout line widths for all lines having a line width marker and line width parameter meet the schematic marker parameters.

The layout versus schematic comparison, a standard operation performed by many software packages, verifies that the marker present in the schematic is also present in the layout. If the line has a constant width and the marker is drawn at the edge of the line, the line width is extracted by this program and compared to the line width property of the schematic marker. This provides a check that the line width has been properly implemented in the layout. Typically, the width is extracted by identifying the ends of the line and measuring the width across the line. However, if the line width varies over its length, or if there is no clear end of the line as the line connects to different circuits and branches out, the width check becomes more difficult. Current software tools are not able to handle these cases.

In this embodiment, once the layout versus schematic is verified, a design representing the layout is extracted in block 112. This extraction comprises in one embodiment obtaining or retrieving the width property that has been entered in the schematic, and annotating the layout with the width property. Once the layout and schematic have been compared, and are found to match, a correspondence between any schematic object marked with a width marker and its related layout object is made. Thus, for every line width marker in the schematic, its line width marker and the line, or net, are associated in a layout database. Once the layout database and circuit schematic are matched through the LVS comparison, each schematic object is associated element by element with its related layout object. Each given net in a schematic has a corresponding drawing in the layout. Every line in the schematic is uniquely identified with its corresponding line in the layout. Every schematic net that has a line width marker also has that marker data associated. Once the schematic and layout are matched, the data that is in the schematic can be transferred to the layout, for example the width parameter. This allows the marker property to be copied from the schematic to the layout. The correlation in one embodiment is stored and can be used later to continue to verify the design as the fabrication process continues.

The design is checked in block 114 to determine whether the design line widths for lines having a line marker in the layout are at least as wide as the layout line widths. A standard width check is typically performed by Design Rule Check (DRC) software. Typical DRC programs, as described above, flag all lines below a certain width. However, such packages only check for one width, the absolute minimum width, for a given layer. In the present embodiment, the DRC program applies the same width check algorithm to every line. However, it first obtains or retrieves the width property associated with the line by the association process described above, and checks the width of the line based on that property. Thus, each selected line is checked for its specific width. For example, one line is checked for a width of 10 microns, while another line is checked for a width of 100 microns. If a line does not have a width marker, it is not be checked. Those non-marked lines are still checked for minimum width by the standard DRC program check.

In one embodiment, for the design check, which in various embodiments is a design rule check (DRC), excludes checking in areas of the integrated circuit near or above a connected transistor. This is because portions of the lines in areas above or near a connected transistor do not need to have the specified minimum widths, especially in the case of a transistor with many legs. A predetermined area is chosen around the area of a transistor that is sufficient to allow the non-standard width requirements for lines in such circumstances and designs.

Figure 2:
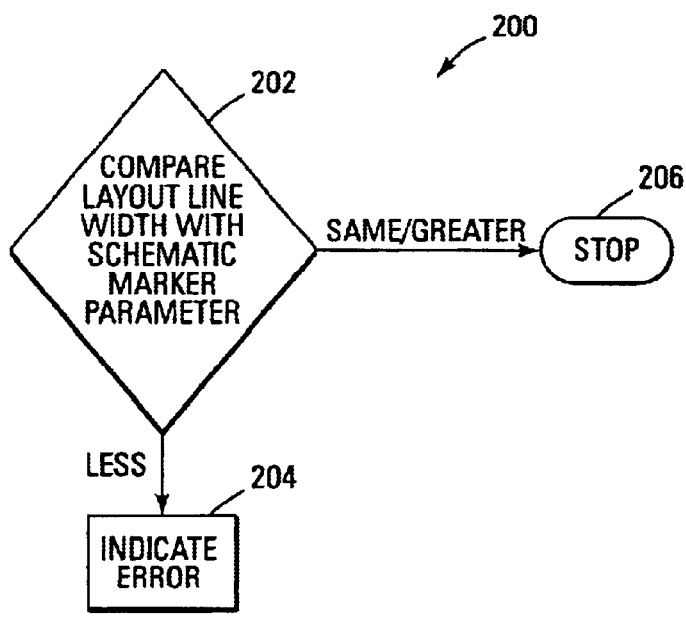
FIG. 2 is a flow chart diagram of a more detailed description of a portion of FIG. 1.

A method 200 for performing a layout versus schematic check on an integrated circuit layout is shown in flow chart form in FIG. 2. Method 200 in one embodiment is an elaboration on block 114 of FIG. 1, and comprises comparing layout line widths with an existing line width marker parameter for each line of a circuit layout in block 202, and indicating an error if a layout line width is less than its line width marker parameter in block 204. Using the various embodiments of marking a schematic and converting it to a layout as have been described above, an existing layout having a line width layer having line width parameters for lines that have a width requirement for a width greater than an absolute minimum line width, such as those lines carrying power or current is used in this method.

The layout has a line width marker and line width parameter for each line having a width that must be maintained through design and implementation. For block 202, the method extracts for each line having a line width marker its respective line width parameter. Then, the extracted line width parameter is compared to the actual line width on the layout. If the actual line width is greater than or equal to the line width parameter, the line width is acceptable and process flow stops at block 206. If the actual line width is less than the line width parameter, an error condition exists, and this error is recorded or indicated at block 204.

Figure 3:
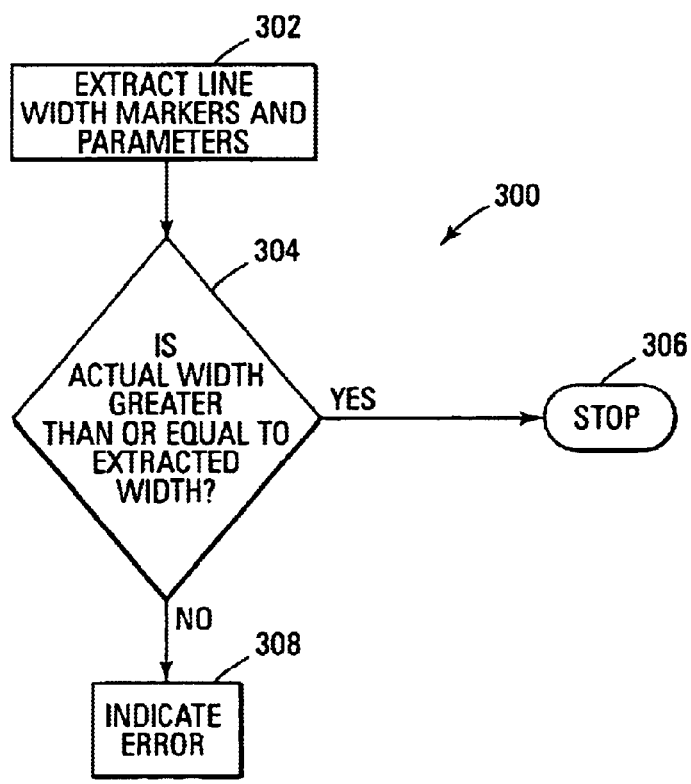
FIG. 3 is a flow chart diagram of a more detailed description of a portion of FIG. 1.

A method 300 for performing a design rule check on an integrated circuit design is shown in flow chart form in FIG. 3. In one embodiment, lines are tagged with line width markers and associated line width parameters in a schematic stage, and carried through to a layout, as discussed in further detail above. Method 300 comprises extracting a line width marker and an associated line width parameter for a design line in block 302, and comparing the extracted line width parameter with the actual design width for each line having a line width marker in block 304. If the actual design line width is greater than or equal to the extracted line width parameter for a given line, the line width is acceptable and process flow stops at block 306. If the actual design line width is less than the line width parameter, an error condition exists and is recorded or indicated at block 308. In one embodiment, the comparison of tagged line widths versus layout line widths is bypassed for predetermined areas of the design on or near a connected transistor.

Figure 4:
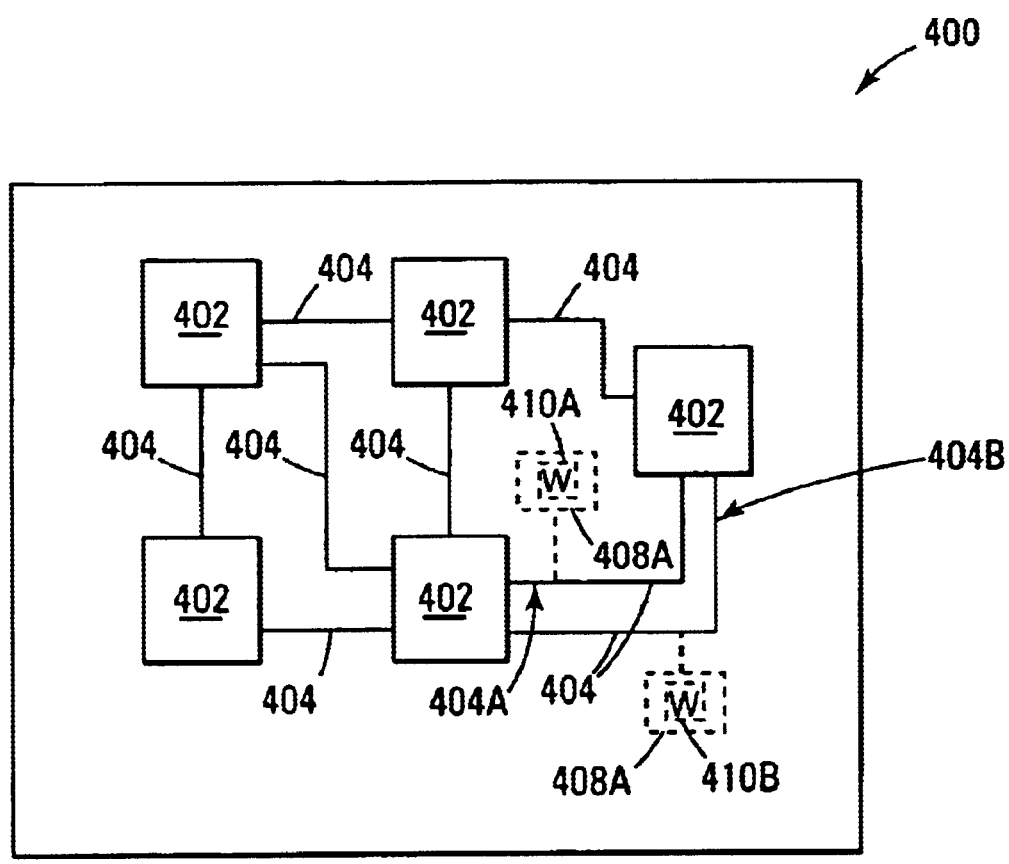
FIG. 4 is a block diagram of a schematic according to one embodiment of the present invention.

A schematic 400 for an integrated circuit is shown in FIG. 4. The schematic 400 comprises a plurality of circuit components 402 interconnected by lines 404. Each line 404 has an associated width. Most lines have a width of a default minimum size, but do not require any special width. However, certain lines, such as those carrying power or current, for example to connected transistors and the like, have a width requirement greater than the default minimum size. A line width layer for the schematic 400 contains in one embodiment a line width marker 408 for each line having a line width greater than the default minimum line width. Each line width marker 408 has an associated line width parameter 410 that represents a minimum line width for the line 404 associated with the marker 408 and parameter 410. As an example, lines 404A and 404B in FIG. 4 have non-default line widths. These widths are contained as line width parameters 410A and 410B in line width markers 408A and 408B respectively, which are in turn contained in line width layer.

Figure 5:
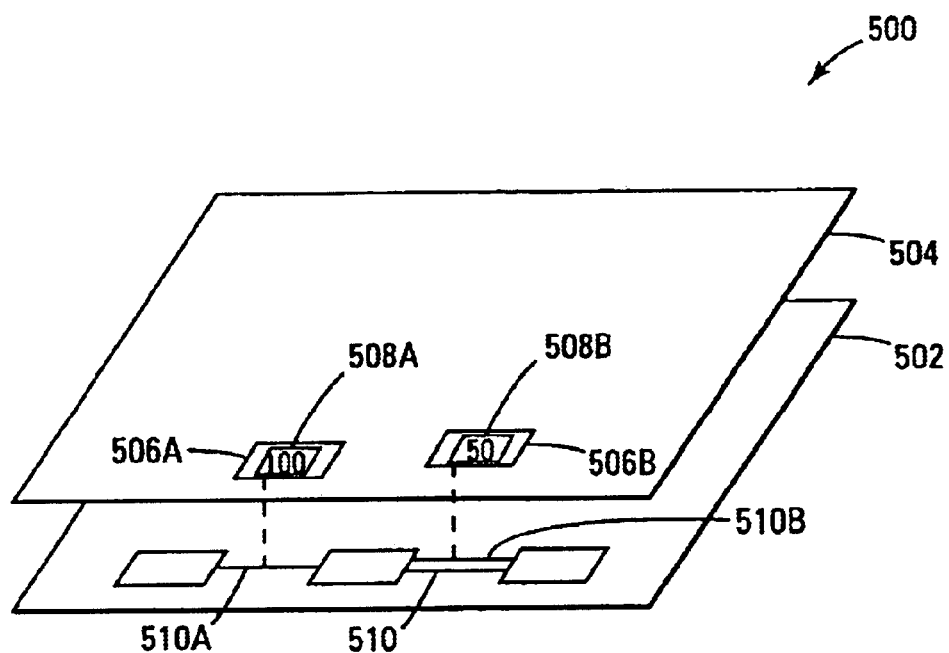
FIG. 5 is a block diagram of a layout according to one embodiment of the present invention.

A layout 500 according to another embodiment of the present invention is shown in layered isometric form in FIG. 5. The layout comprises a component layer 502 having a plurality of circuit components interconnected by a plurality of lines. Each of the lines has some associated width, which are in one embodiment stored in line width layer 504. Some lines have minimum widths that are greater than an absolute minimum width due to their functions or expected uses, such as carrying power or current. Thus, some lines have minimum widths that are significantly larger than a typical minimum line width in an integrated circuit. For each line having a non-minimum width, a width marker 506 is associated with the line. Each width marker also has an associated width parameter 508. For example, line 510A has a line width marker 506A with an associated line width parameter 508A of 100 microns. This line width parameter 508A is present in the marker 506A, which in one embodiment is positioned in a separate line width layer of the circuit schematic and layout. In this example, line 510B has a line width marker 506B with an associated line width parameter 508B of 50 microns.

By way of example only and not by way of limitation, advantages of the various embodiments of the present invention include improved accuracy in checking for non-standard line widths, and accuracy in transferring schematics to layouts to designs.

Figure 6:
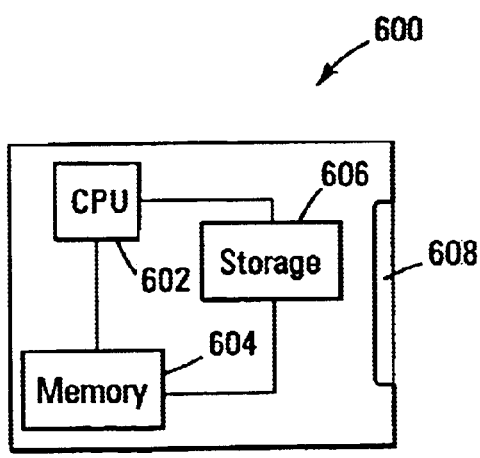
FIG. 6 is a block diagram of a computer on which embodiments of the present invention are practiced.

The methods shown in the Figures may be implemented in whole or in part in various embodiments in a machine readable medium comprising machine readable instructions for causing a computer such as is shown in the Figures to perform the methods. A computer 600 on which embodiments of the present invention are run is shown in FIG. 6. The computer programs run on a central processing unit (CPU) 602 out of main memory 604, and may be transferred to main memory from permanent storage 606 via disk drive or CD-ROM drive when stored on removable media or via a network connection 608 or modem connection when stored outside of the computer 600, or via other types of computer or machine readable media from which it can be read and utilized.

Such machine readable media may include software modules and computer programs. The computer programs may comprise multiple modules or objects to perform the methods in Figures or the functions of various apparatuses of the Figures. The type of computer programming languages used to write the code may vary between procedural code type languages to object oriented languages. The files or objects need not have a one to one correspondence to the modules or method steps described depending on the desires of the programmer. Further, the method and apparatus may comprise combinations of software, hardware and firmware as is well known to those skilled in the art.

CONCLUSION

A method for checking line width in integrated circuit design has been described that includes marking each non-standard line with a line width marker, and associating the line width marker with the line to allow the line width to be checked at any point in the design process against the desired line width. This is accomplished in part using the annotation of the layout with the line widths marked on corresponding schematics, and a DRC based on a variable line width parameter, which differs for specific geometries.

It is to be understood that the above description is intended to be illustrative, and not restrictive. Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed:

1. A method for checking accuracy of an integrated circuit, comprising:

tagging at least one line with a line width marker;

laying out the lines;

retrieving the line width marker for each tagged line having a line width greater than an absolute minimum line width;

comparing an actual line width with the marker line width;

and flagging any lines with a width below the marker line width.

2. The method of claim 1, wherein tagging is accomplished in a line width layer.

3. The method of claim 1, and further comprising:

associating line width markers with their respective lines in a layout database.

4. A machine readable medium having a set of machine readable instructions for causing a computer to perform a method comprising:

tagging each of a plurality of lines with a width marker;

retrieving the width marker for each of the plurality of tagged lines, each having a line width greater than an absolute minimum line width;

comparing an actual line width with the marker line width; and flagging any lines with a width below the marker line width.

5. The machine readable medium of claim 4, wherein the method further comprises:

associating line width markers with their respective lines in a layout database.

6. A machine readable medium having a set of machine readable instructions for causing a computer to perform a method comprising:

retrieving a width marker for each of a plurality of tagged lines having a line width greater than an absolute minimum line width; and comparing an actual line width with the marker line width; and flagging any lines with a width below the marker line width.

7. The machine readable medium of claim 6, wherein the method further comprises:

associating line width markers with their respective lines in a layout database.

* * * * *